(12) United States Patent
Fohrenkamm et al.

(10) Patent No.: US 8,771,925 B2
(45) Date of Patent: Jul. 8, 2014

(54) FLEXOGRAPHIC PROCESSING SOLUTION AND METHOD OF USE

(75) Inventors: Elsie A. Fohrenkamm, St. Paul, MN (US); M. Zaki Ali, Mendota Heights, MN (US); Michael B. Heller, Iver Grove Heights, MN (US)

(73) Assignee: Eastman Kodak Company, Rochester, NY (US)

( * ) Notice: Subject to any disclaimer, the term of this patent is extended or adjusted under 35 U.S.C. 154(b) by 535 days.

(21) Appl. No.: 12/546,780

(22) Filed: Aug. 25, 2009

(65) Prior Publication Data

US 2011/0053090 A1    Mar. 3, 2011

(51) Int. Cl.
 *G03F 7/00* (2006.01)
 *G03F 7/26* (2006.01)
 *G03C 5/26* (2006.01)
 *B41M 5/00* (2006.01)
 *B41N 1/00* (2006.01)

(52) U.S. Cl.
 USPC ........ 430/306; 430/270.1; 430/309; 430/434; 101/453; 101/463.1

(58) Field of Classification Search
 USPC ................ 430/331, 334, 434, 270.1–306
 See application file for complete search history.

(56) References Cited

U.S. PATENT DOCUMENTS

| | | | |
|---|---|---|---|
| 4,755,451 A * | 7/1988 | Le et al. | 430/331 |
| 4,867,800 A | 9/1989 | Dishart et al. | |
| 4,934,391 A | 6/1990 | Futch et al. | |
| 4,935,579 A | 6/1990 | Berg | |
| 4,992,108 A | 2/1991 | Ward et al. | |
| 5,011,620 A | 4/1991 | Dishart et al. | |
| 5,062,988 A | 11/1991 | Dishart et al. | |
| 5,084,200 A | 1/1992 | Dishart et al. | |
| 5,302,313 A | 4/1994 | Asano et al. | |
| 5,354,645 A | 10/1994 | Schober et al. | |
| 5,378,386 A | 1/1995 | Short et al. | |
| 5,521,054 A * | 5/1996 | Takagi et al. | 430/331 |
| 5,672,579 A | 9/1997 | Diaz et al. | |
| 6,162,593 A * | 12/2000 | Wyatt et al. | 430/331 |
| 6,248,502 B1 | 6/2001 | Eklund | |
| 6,582,886 B1 | 6/2003 | Hendrickson et al. | |
| 6,682,877 B2 | 1/2004 | Wyatt et al. | |
| 6,897,008 B1 | 5/2005 | Hendrickson et al. | |
| 7,226,709 B1 | 6/2007 | Kidnie et al. | |
| 7,235,346 B2 | 6/2007 | Knöll et al. | |
| 7,326,353 B2 | 2/2008 | Hendrickson et al. | |
| 2004/0142282 A1* | 7/2004 | Hendrickson et al. | 430/300 |
| 2004/0152019 A1* | 8/2004 | Wyatt et al. | 430/300 |
| 2004/0187719 A1* | 9/2004 | Knoll et al. | 101/401.1 |
| 2005/0227182 A1 | 10/2005 | Ali et al. | |
| 2008/0061036 A1* | 3/2008 | Schadebrodt et al. | 216/94 |
| 2010/0068651 A1* | 3/2010 | Bradford | 430/306 |

FOREIGN PATENT DOCUMENTS

| | | |
|---|---|---|
| EP | 0 433 374 | 3/1990 |
| WO | 90/08206 | 7/1990 |

OTHER PUBLICATIONS

U.S. Appl. No. 12/327,937, filed Dec. 4, 2008, titled "Flexographic Element and Method of Imaging" by Veres et al.
U.S. Appl. No. 12/545,268, filed Aug. 21, 2009, titled "Developing Solution for Flexographic Printing Plates" by D.C. Bradford.

* cited by examiner

Primary Examiner — Chanceity Robinson
(74) Attorney, Agent, or Firm — J. Larry Tucker

(57) ABSTRACT

A processing solution is used to provide flexographic relief printing plates. This solution includes diisopropylbenzene, and one or more organic co-solvents, at least one of which is an aliphatic dibasic acid ester. The processing solution may also include one or more alcohols as co-solvents.

14 Claims, No Drawings

FLEXOGRAPHIC PROCESSING SOLUTION AND METHOD OF USE

FIELD OF THE INVENTION

This invention relates to a processing solution that can be used as a developer or "washout" solution in the preparation of flexographic relief images. This invention also relates to a process of preparing flexographic printing plates having relief images.

BACKGROUND OF THE INVENTION

Flexography is a type of relief printing that uses flexible sheets of photopolymer to transfer an image onto a substrate. The photopolymer sheet is generally exposed to suitable radiation (usually actinic or visible or UV light) through a negative or mask that blocks selected portions of the photopolymer from the light. The portions of the photopolymer that are exposed are crosslinked or hardened and the non-exposed portions are removed because of their solubility in various organic solvents in a "washout" or development process. The resulting developed flexographic printing plate has a raised relief image in those portions that were exposed to radiation. The flexible printing plate is usually wrapped around a cylinder on a printing press and used to transfer ink to a suitable substrate such as papers, films, fabrics, ceramics, and other materials.

While the non-exposed photopolymer may be soluble in a variety of organic solutions, only some of those solutions are the best developers that do not damage or swell the crosslinked portions while cleanly removing the non-crosslinked portions. Swelling will eventually cause the relief image to deteriorate in the processing bath and the processing solution will have to be changed frequently due to the build-up of sludge.

The development or washout of imaged photopolymerizable flexographic printing plate precursors is well known, for example as described in U.S. Pat. No. 5,354,645 (Schober et al.) and U.S. Pat. No. 6,162,593 (Wyatt et al) and U.S. Patent Application Publication 2005/0227182 (Ali et al.), and the references cited in therein. Representative processing solutions (developers) are also described in U.S. Pat. No. 6,248,502 (Eklund). Sometimes, the photopolymer compositions used in the flexographic printing plate precursors are carefully matched to the desired processing solutions.

Many known processing solutions include chlorohydrocarbons, saturated cyclic or acyclic hydrocarbons, aromatic hydrocarbons, lower aliphatic ketones, and terpene hydrocarbons. While these processing solutions are effective for the intended purpose, they have a number of disadvantages. They may act too slowly, causing swelling in the printing plates and thus damage the fine detail in the relief images, require long drying times, and have low flashpoints resulting in dangerous situations. Many of these solvents are also considered hazardous air pollutants (HAPS) and are subject to stringent governmental reporting requirements. They may also be too toxic for direct disposal into the environment or create worker safety problems with strong odors or handling problems.

More recently, there has been an emphasis on reclaiming processing solutions. A major drawback of reclamation processes is the lack of an inexpensive method for reclaiming the solvent for subsequent use. Reclamation and recycling of processing solvents generally require distillation that is energy and labor intensive. Improved reclamation processes are described for example in U.S. Pat. No. 7,326,353 (Hendrickson et al.) in which centrifugation is used alone or in combination with filtration to remove solids from reusable processing solvents.

Copending and commonly assigned U.S. Ser. No. 12/391,344 filed Feb. 24, 2009 by Bradford and Ali describes the use of microfiltration techniques for reclamation of processing solvents.

Copending and commonly assigned U.S. Ser. No. 12/545,268 filed Aug. 21, 2009 by Bradford and based on Provisional Application 61/097,358 (filed Sep. 19, 2008 by Bradford) describes flexographic printing plate washout or processing solutions containing dipropylene glycol dimethyl ether (DME) alone or in combination with various co-solvents such as alcohols and aliphatic dibasic acid ethers.

U.S. Pat. No. 6,162,593 (noted above) describes the use of diisopropylbenzene (DIPB) alone or with alcohol co-solvents in processing solutions.

Aliphatic dibasic acid is used in cleaning compositions as described in U.S. Pat. No. 4,867,800 (Disharat et al.), U.S. Pat. No. 5,011,620 (Dishart et al.), and U.S. Pat. No. 5,378,386 (Laven et al.).

Whether the processing solutions are reclaimed or not, there is a need for more environmentally friendly developing solutions that offer improvements in handling, disposal, low odor, and low levels of volatility (lower level of "volatile organic chemicals", or "VOC" content) while still providing the effective cleanout (or washout) of non-polymerized material in an imaged flexographic printing plate precursor. It is also desirable that the processing solution be useful for a variety of photopolymer compositions so that the processing solution is versatile for multiple uses.

SUMMARY OF THE INVENTION

The present invention provides a processing solution for providing a flexographic relief printing plate comprising:
1) diisopropylbenzene, and
2) one or more organic co-solvents, at least one of which is an aliphatic dibasic acid ester.

This invention also provides a method for providing a flexographic printing plate comprising:
developing an imagewise exposed flexographic printing plate precursor with the processing solution of this invention to provide a relief image in a flexographic printing plate.

In other embodiments of this invention, a method for providing a flexographic printing plate comprises:
A) imagewise exposing a flexographic printing plate precursor to provide exposed and non-exposed regions,
B) removing the non-exposed regions with a processing solution of the present invention to provide a relief image in a flexographic printing plate, and
C) optionally, drying the processed flexographic printing plate.

The processing solution of this invention provides a more environmentally friendly means for providing flexographic printing plates because of the higher boiling points of the solvents used therein. There less odor from the processing solution while it can be used for high printing plate throughput and good drying characteristics. The processed flexographic printing plates do not suffer excessive surface swelling during processing but the non-polymerized material is washed out to provide sharp relief images.

DETAILED DESCRIPTION OF THE INVENTION

Unless otherwise indicated, the terms "processing solution", "developer", "washout solution" all refer to the compositions of this invention.

In addition, all percentages of processing solutions, unless otherwise noted, represent weight %.

The present invention provides a unique and advantageous flexographic printing plate processing solution containing at least diisopropylbenzene and an aliphatic dibasic acid ester as at least one of the co-solvents. These processing solutions can be used to develop an array of different imaged flexographic printing plate precursors that are described in more detail below.

Diisopropylbenzene (DIPB) is a chemical that is produced as a byproduct of the cumene manufacturing process, wherein benzene is reacted with propylene to form isopropylbenzene. The properties of diisopropylbenzene are well known (see for example U.S. Pat. No. 6,162,593, noted above). It can be obtained from a number of commercial sources such as Eastman Chemical Company (Kingsport, Tenn.) and JLM Chemical Inc. (Blue Island, Ill.).

The processing solution comprises at least 5 and up to 95 weight % of diisopropylbenzene, and typically from about 5 to about 70 weight %.

The processing solution also includes from about 5 to about 70 weight % of one or more organic co-solvents, and typically from about 10 to about 60 weight % of one or more of these solvents, provided that at least one of the co-solvents is an aliphatic dibasic acid ester.

Useful aliphatic dibasic acid esters include but are not limited to, aliphatic diesters of dicarboxylic acids, such as oxalic acid, malonic acid, succinic acid, glutaric acid, adipic acid, pimelic acid, suberic acid, azelaic acid, and sebacic acid, such as dimethyl-2-methylglutarate, dimethyl adipate, dimethyl glutarate, dimethyl succinate, diisobutyl succinate, diisobutyl adipate, and diisobutyl glutarate. Dimethyl and diisobutyl esters of dicarboxylic acids are particularly useful. Mixtures of these aliphatic dibasic acid esters can be used. Dimethyl-2-methylglutarate is particularly useful. Such compounds are also available from various commercial sources. For example, dimethyl-2-methylglutarate can be obtained as Rhodiasolv® IRIS from Rhodia (Cranbury, N.J.). Similarly, a mixture of dimethyl glutarate, succinate, and adipate and a mixture of diisobutyl glutarate, succinate, and adipate can be obtained from Rhodia as Rhodiasolve® RPDE and Rhodiasolv® DIB, respectively.

The aliphatic dibasic acid ester is present in the processing solution in an amount of from about 5 and less than 70 weight %, and typically from about 10 to about 65 weight %. For example, dimethyl-2-methylglutarate can be present in an amount of from about 10 to about 60 weight %.

The weight ratio of DIPB to the aliphatic dibasic acid ester is generally from about 1:10 to about 5:1, or typically from about 1:9 to about 3:2, although a weight ratio may be useful outside these ranges if the chemical composition of the printing plate precursor is suitable for a different weight ratio.

The processing solution can also include one or more alcohols as co-solvents in an amount of up to 35 weight %, or typically from about 5 to about 35 weight %.

There are a vast number of alcohols that can be used in the fashion and the following list is not meant to be exhaustive, but representative of the most useful alcohols. Such alcohol co-solvents include one or more of n-butanol, 2-ethoxyethanol, benzyl alcohol, a hexyl alcohol, a heptyl alcohol, an octyl alcohol, a nonyl alcohol, a decyl alcohol, 2-phenylethyl alcohol, isopropylbenzyl alcohol, alpha-terpineol, dipropylene glycol methyl ether, 2-butoxyethanol, isopropyl alcohol, and 2-(2-butoxyethoxy) ethanol, substituted or unsubstituted cyclopentanol, substituted or unsubstituted cyclohexanol, substituted or unsubstituted cycloheptanol, cyclopentyl substituted alcohol, cyclohexyl substituted alcohol, or cycloheptyl substituted alcohol.

Three useful alcohol co-solvents include one or more of 2-ethylhexyl alcohol, 2-phenylethyl alcohol, and isopropylbenzyl alcohol. Other organic solvents can be present if desired including a hydrocarbon paraffin, petroleum distillates, terpene hydrocarbons, mixed aromatic solvents, or halogenated hydrocarbon solvents. When present, such solvents may comprise up to 35 volume % of the processing solution. An advantage of the present invention is that such organic solvents are not generally needed for effective development of many photopolymer-containing flexographic printing plate precursors.

The processing solution can optionally include one or more hydrocarbon paraffins, isoparaffins, naphthenic hydrocarbons, or combinations thereof.

Some embodiments of the present invention include a processing solution comprising:

from about 30 to about 80 weight % of diisopropylbenzene,
from about 10 to about 60 weight % of dimethyl-2-methylglutarate, and
from about 5 to about 35 weight % of one or more alcohols selected from the group consisting of benzyl alcohol, 2-ethylhexyl alcohol, 2-phenylethyl alcohol, and isopropylbenzyl alcohol, and the weight ratio of DIPB to dimethyl-2-methylglutarate is from about 1:9 to about 3:2.

After suitable use, the processing solution of this invention can be reclaimed in a suitable fashion or disposed of in an environmentally proper manner.

Some useful flexographic printing plate precursors are described in U.S. Patent Application Publication 2005/0227182 (noted above) and U.S. Pat. No. 7,226,709 (Kidnie et al.) and U.S. Pat. No. 7,348,123 (Mengel et al.), all of which are incorporate herein by reference.

For example, the precursors are generally composed of a photopolymerizable elastomer or elastomeric layer composition disposed on a suitable support. By "photopolymerizable", we mean that the composition is polymerizable or crosslinkable using suitable radiation, or both polymerizable and crosslinkable. The elastomeric layer composition generally includes a thermoplastic binder, at least one monomer and an initiator (photoinitiator) that is sensitive to suitable radiation such as actinic radiation (for example, UV radiation). Various polymeric binders are known in the art as described in the publications noted in the preceding paragraph. Poly(styrene/isoprene/styrene) and poly(styrene/butadiene/styrene) block copolymers are useful, as well as various synthetic or natural polymers of conjugated hydrocarbons, including polyisoprene, 1,2-polybutadiene, and butadiene/acrylonitrile.

The "monomer" is generally considered a compound that is compatible with the polymeric binder and is capable of addition polymerization in response to irradiation with actinic radiation. There can be a mixture of monomers if desired. They typically have a molecular weight less than 5000 although compounds with higher molecular weight can be used if desired. Useful monomers include various acrylates, methacrylates, mono- and polyesters of alcohols and polyols such as polyacrylates and polymethacrylates. Photoinitiators can include but are not limited to, compounds that generate free radicals upon exposure to actinic radiation such as quinones, benzophenones, benzoin ethers, aryl ketones, peroxides, biimidazoles, benzyl dimethyl ketal, and others known in the art.

The elastomeric layer composition can also include various additives such as colorants, processing aids, antioxidants, and antiozonants as are known in the art.

Additionally, a protective cover sheet can be placed over the photosensitive elastomeric composition layer, which cover sheet contains a protective polymer that is soluble or dispersible in the solvent(s) that is capable of dissolving or dispersing the uncured photosensitive elastomeric composition. Generally, the protective layer is transparent and has little tackiness before irradiation. It can be washed away or removed using the processing solutions described herein. Examples of polymers suitable for preparing this cover sheet include but are not limited to, polyamides and cellulose esters such as cellulose acetate butyrate and cellulose acetate propionate (for example, see U.S. Pat. No. 6,030,749 of Takahashi et al., Cols. 4-8).

The flexographic printing plate precursors that can be processed according to this invention in general comprise a photopolymerizable layer comprising an elastomeric binder, a photoinitiator, at least one compound that is free radical crosslinkable with actinic radiation, and optionally a plasticizer.

Such flexographic printing plate precursors can be imaged by exposure to curing radiation through a suitable mask image to form an imaged element. In this step, the curing radiation is projected onto the photosensitive composition through the mask image that blocks some of the radiation. The exposed regions are hardened or cured. Exposure through the mask image can be accomplished by floodwise exposure from suitable irradiation sources (visible or UV radiation). For example, curing radiation may be at a radiation at a wavelength of from about 340 to about 400 nm from a suitable irradiation source. The time for exposure through the mask image will depend upon the nature and thickness of the flexographic printing plate precursor and the source of the radiation. For example, useful commercial flexographic printing plate precursors such as Eastman Kodak's FLEXCEL brand precursors and DuPont's Cyrel brand precursors can be imaged on commercial apparatus such as a Mekrom processor, model 302 EDLF.

The processing solution can be applied to an imaged flexographic printing plate precursor in any suitable manner including but not limited to spraying, brushing, rolling, dipping (immersing), or any combination thereof. This removes uncured or non-polymerized regions of the photopolymerizable composition. Development or processing is usually carried out under conventional conditions such as for from about 5 to about 20 minutes and at from about 23 to about 32° C. The specific development conditions will be dictated by the type of apparatus used and the specific processing solution.

Post-developing processing of the relief image may be suitable under some circumstances. Typical post-development processing includes drying the relief image to remove any excess processing solution and post-curing by exposing the relief image to curing radiation to cause further hardening or crosslinking. The conditions for these processes are well known to those skilled in the art. For example, the relief image may be blotted or wiped dry or dried in a forced air or infrared oven. Drying times and temperatures would be readily apparent to one skilled in the art.

Detackification can be carried out if the flexographic printing plate is still tacky after drying. Such treatments, for example, by treatment with bromide or chlorine solutions or exposure to UV or visible radiation, are well known to a skilled artisan.

The resulting relief image may have a depth of from about 2% to about 100% (typically from about 10 to about 80%) of the original thickness of the radiation-sensitive composition in the flexographic printing plate precursor. For example, if the radiation-sensitive composition is disposed on a non-photosensitive support, up to 100% of the radiation-sensitive composition can be removed in the relief image. The relief image depth may be from about 150 to about 2000 μm The flexographic printing plates can be used to advantage in the formation of seamless, continuous flexographic printing elements, or they can be formed as flat sheets that can be wrapped around a cylinder form, for example as a printing sleeve or the printing cylinder itself. Alternatively, the radiation-sensitive composition can be mounted around a cylindrical form for imaging and development.

The present invention provides at least the following embodiments and combinations thereof:

1. A processing solution for providing a flexographic relief printing plate comprising:
   1) diisopropylbenzene, and
   2) one or more organic co-solvents, at least one of which is an aliphatic dibasic acid ester.

2. The solution of embodiment 1 comprising up to 95 weight % of diisopropylbenzene, and from about 5 to about 70 weight % of the organic co-solvents.

3. The solution of embodiment 1 or 2 wherein the aliphatic dibasic acid ester is present in an amount of from about 5 and less than 70 weight %.

4. The solution of any of embodiments 1 to 3 wherein the aliphatic dibasic acid is an aliphatic diester of a dicarboxylic acid.

5. The solution of any of embodiments 1 to 4 wherein the aliphatic dibasic acid ester is an aliphatic diester of oxalic acid, malonic acid, succinic acid, glutaric acid, adipic acid, pimelic acid, suberic acid, azelaic acid, or sebacic acid, or combinations thereof, that is present in an amount of from about 10 to about 65 weight %.

6. The solution of any of embodiments 1 to 5 wherein the aliphatic dibasic acid ester is a dimethyl or diisobutyl ester of a dicarboxylic acid.

7. The solution of any of embodiments 1 to 6 wherein the weight ratio of diisopropylbenzene to the aliphatic dibasic acid ester is from about 1:10 to about 5:1.

8. The solution of any of embodiments 1 to 7 wherein at least one of the co-solvents is an alcohol that is present in an amount of up to 35 weight %.

9. The solution of embodiment 8 wherein the alcohol co-solvent includes one or more of n-butanol, 2-ethoxyethanol, benzyl alcohol, a hexyl alcohol, a heptyl alcohol, an octyl alcohol, a nonyl alcohol, a decyl alcohol, 2-phenylethyl alcohol, isopropylbenzyl alcohol, alpha-terpineol, dipropylene glycol methyl ether, 2-butoxyethanol, isopropyl alcohol, and 2-(2-butoxyethoxy) ethanol, substituted or unsubstituted cyclopentanol, substituted or unsubstituted cyclohexanol, substituted or unsubstituted cycloheptanol, cyclopentyl substituted alcohol, cyclohexyl substituted alcohol, or cycloheptyl substituted alcohol.

10. The solution of either embodiment 8 or 9 wherein the alcohol co-solvent is one or more of 2-ethylhexyl alcohol, 2-phenylethyl alcohol, and isopropylbenzyl alcohol.

11. The solution of any of embodiments 1 to 10 further comprising a hydrocarbon paraffin, isoparaffin, naphthenic hydrocarbon, or a combination thereof.

12. The solution of any of embodiments 1 to 11 comprising:
   from about 30 to about 80 weight % of diisopropylbenzene,
   from about 10 to about 60 weight % of dimethyl-2-methylglutarate, and from about 5 to about 35 weight % of one or more alcohols selected from the group consisting of benzyl alcohol, 2-ethylhexyl alcohol, 2-phenylethyl alcohol, and isopropylbenzyl alcohol, and and the weight ratio of diisopropylbenzene to dimethyl-2-methylglutarate is from about 1:9 to about 3:2.

13. A method for providing a flexographic printing plate comprising:

developing an imagewise exposed flexographic printing plate precursor with the processing solution of any of embodiments 1 to 12 to provide a relief image in a flexographic printing plate.

14. A method for providing a flexographic printing plate comprising:

A) imagewise exposing a flexographic printing plate precursor to provide exposed and non-exposed regions, B) removing the non-exposed regions with a processing solution of any of the embodiments 1 to 12 to provide a relief image in a flexographic printing plate, and C) optionally, dying the processed flexographic printing plate.

15. The method of embodiment 14 wherein the flexographic printing plate precursor comprises a photopolymerizable elastomeric layer comprising an elastomeric binder, an initiator, at least one monomer, and optionally a plasticizer, and the precursor is imagewise exposed using actinic radiation.

The following examples are provided to illustrate the practice of this invention but they are not intended to be limiting in any fashion.

Invention Example 1

A flexographic plate developer composition was prepared comprising 20 wt. % of Rhodiasolv® Iris (containing dimethyl-2-methyl glutarate) from Rhodia-Novecare of Cranbury, N.J., which is considered to be a non-VOC solvent according to EU regulation 1999/13/EC, and 80 wt. % of diisopropyl benzene. This developer composition was charged to a commercially available Kelleigh model 310 processor containing a processing drum. A sample of the commercially available 0.067 inch (0.17 cm) thick photopolymer flexographic printing plate (Kodak Flexcel® NXH) was cut into sample strips measuring 2 inches×12 inches (5.1 cm×30.5 cm). The cover sheets from the ample strips were then removed, and the sample strips were then clamped down, 8 abreast, along the width of the processing drum. The brush pressure in the processor was adjusted to a setting of 3.5 and processing was started using the developer composition. Beginning after 8 minutes of processing, one of the samples was removed at 2 minutes intervals. Each sample strip was blotted dry with a non-lint plate wipe fabric and was placed in the Kelleigh drying section set to 60° C.

After drying for 2 hours, the sample strips were removed from the drying section to provide sample flexographic printing plates. The dried printing plates were then light finished with 9 minutes exposure to UVC light and 4 minutes exposure to UVA light using the Mekrom model 302 EDLF unit. Measurements were made with an Ono-Sokki model EG-225 digital caliper comparing the unexposed washed out area of the printing plate to the original plate caliper (0.067 inch, 0.17 cm). The difference between the non-exposed washed out printing plate and the original plate caliper was recorded as the relief depth that was plotted versus the processing times. The point where processing time intersected a 0.040" (0.1 cm) relief depth was determined to be the wash-out time. The wash-out time for the inventive developer composition was found to be 10 minutes.

To determine the "dry time" with the inventive developer composition, the same commercially available photopolymer flexographic printing plate as described above, was first back exposed from a UV light source for 14 seconds, to give a floor thickness of 0.027 inch (0.069 cm). The cover sheet was then removed, and an imaged mask was produced by a commercially available Kodak Flexcel® NX Thermal Imaging device and the Kodak Flexcel® NX thermal imaging layer was laminated at room temperature to the flexographic photopolymer printing plate. The photopolymer printing plate precursor was then exposed to UV light for 12 minutes through the negative mask. The images on the mask contained multiple repeating sections of small halftone dots of various line rulings as well as fine line and text images to gage image quality. The mask also contained $D_{min}$ areas to generate fully crossed linked patches on the printing plate for caliper measurements to determine drying time. A commercially available Mekrom model 302 EDLF unit was used for the UV exposure sequence. After the UV exposure, the mask was removed from the exposed printing plate and it was processed in the Kelleigh model 310 processor for 10 minutes (the wash-out time). After processing, the printing plate was blotted dry using a non-lint plate wipe fabric and placed in the drying section of the Kelleigh processor. Caliper measurements of the printing plates in the fully exposed area were made at 10 minute intervals using an Ono-Sokki model EG-225 digital caliper. The printing plate "dry time" was determined to be at a point when the printing plates reached a steady state where no further thickness decrease was measured.

The dried printing plate was then light finished with 9 minutes exposure to UVC light and 4 minute exposure to UVA light using the Mekrom model 302 EDLF unit. After light finishing, the printing plates were examined under a 60× stereo microscope to determine image quality. Image quality determination was made by examining the areas of small dots and looking for miss-shaped or missing dots. The fine line rulings and text areas were examined for shoulder angle and structure. The overall quality of the printing plate image was deemed to be excellent.

The odor of the developer composition was quite mild and the dried printing plate also had a mild odor.

Comparative Example 1

The procedure of Invention Example 1 was followed except that a commercially available flexographic plate developer composition called Dupont Optisol Rotary was used for processing. The wash-out time for this developer composition was determined to be 20 minutes to achieve the same relief depth as in Invention Example 1 (0.04 inch, 0.1 cm), which is twice as long as for the Inventive developer composition. The dry time with the comparative developer composition was similar (90 minutes) to the Invention developer composition (105 minute). The image quality was also found to be similar to that obtained in Invention Example 1. The comparative developer composition, however, it had a moderate odor and contained no known non-VOC solvent.

Comparative Example 2

The procedure of Invention Example 1 was followed except that a commercially available flexographic plate developer composition called MacDermid Solvit was used for processing. The wash-out time and the dry time were found to be 11 minute and 105 minutes, respectively, to achieve similar image quality as in Invention Example 1. This developer composition, however, had a moderate odor and also left a moderate odor on the finished and dried plate. This printing plate developer composition contained no known non-VOC solvent.

Invention Examples 2-8 and Comparative Example 3

A prototype R&D processor was used to evaluate various developer composition combinations of diisopropylbenzene and Rhodiasolv® Iris according to the present invention, and to compare these compositions with commercially available developer compositions. The flexographic printing plate precursors used were the same as those described in Invention Example 1.

To determine the developer processing time, the photopolymer printing plate precursor was first UV exposed on the Mekrom model 302 EDLF unit for 5 minutes. A 5 inches×5 inches (12.7×12.7 cm) area in the center of each printing plate precursor was covered by an opaque mask (orange rod) to provide an unexposed area and the exposed printing plate precursor sample was placed at the bottom of a shallow pan. A 350 ml aliquot of the developer composition (see TABLE I below) was added to the pan and placed under the brush section of the R&D processor. The brush was used to rub the submerged surface of the exposed printing plate precursor in a reciprocating motion for 1 minute. After this time, the pan containing the exposed printing plate precursor was turned 90 degrees and rubbed for an additional 1 minute. This was repeated until the exposed printing plate precursor had been rubbed in all 4 directions for a total of 4 minutes. The processed printing plate was removed from the pan, blotted dry with a non-lint plate wipe, and placed in a 60° C. oven to dry. The spent developer compositions were poured from the pan and collected for disposal. A second sample of the exposed printing plate precursor was placed in the pan and a second aliquot of fresh developer composition was added to the pan. The second exposed printing plate was processed with the same procedure except that the total processing time was increased to 6 minutes. This was repeated twice and for each subsequent printing plate sample, the processing time was increased by an additional 2 minutes.

After drying for 2 hours, each printing plate was removed from the oven. The dried printing plates were then light finished with 9 minutes exposure to UVC light and 4 minutes exposure to UVA light using the Mekrom model 302 EDLF unit. Measurements were made with an Ono-Shokie model EG-225 digital caliper comparing the non-exposed area of the printing plate to the exposed area. The difference between the exposed and unexposed areas was recorded as "relief depth" that was plotted versus processing times for each developer composition. The point where processing time intersected a 0.040 inch (0.1 cm) relief depth is listed in TABLE I as the "developer time".

To determine the dry time and image quality, the commercially available photopolymer flexographic printing plate (Kodak Flexcel® NXH) was exposed from the backside, and then exposed from the frontside through a mask as described in Invention Example 1. The mask was then removed from the exposed printing plate precursor that was then cut into sample sections, each having a latent image of the image quality target. The exposed samples were then processed using the prototype processor having various developer compositions as listed in TABLE I below. Processing was carried out at ambient temperature (20° C.).

After this processing, the resulting flexographic printing plates were blotted dry using a non-lint plate wipe fabric and placed in a drying oven at 60° C. Caliper measurements of the printing plates in the fully exposed areas were made at 10 minute intervals using an Ono-Shokie model EG-225 digital caliper. The "Dry Times" listed in TABLE I were determined when the printing plates reached a steady state where no thickness decrease was measured.

The dried printing plates were then lightly finished with 9 minutes exposure to UVC light and 4 minutes exposure to UVA light using the Mekrom model 302 EDLF unit. The plates were then examined under a 60× stereo microscope to determine image quality by examining the areas of small dots and looking for misshapen or missing dots. The fine line rulings and text areas were examined for shoulder angle and structure. The results of this examination are listed as "Image Quality" in TABLE I.

To determine the percent swell and percent weight gain, the commercially available photopolymer flexographic printing plate precursor (Kodak Flexcel® NXH) was first exposed through the backside using a UV light source for 15 seconds. Next, the frontside was given a main exposure of UV light for 12 minutes. A commercially available Mekrom model 302 EDLF unit was used for the UV exposure sequence. This exposure method insures that the photopolymer was fully crossed linked throughout its entire thickness.

The exposed printing plate precursor was cut into strips measuring ¾ inch×3 inches (1.9 cm×7.6 cm). After removing the cover sheets from the sample strips, each of the sample strips was weighed using a Mettler AC-100 analytical balance with a precision to 0.0001 g. The thickness of each sample strips was also measured with an Ono-Shokie model EG-225 digital caliper with a precision to 0.0001 inch (0.00254 cm).

After the initial weight and thickness of the sample strips were measured and recorded, the sample strips were placed singly into vials containing 100 ml of each of the various developer compositions listed in TABLE I. The depth was adequate to allow complete submersion of the samples that were allowed to soak in the developer compositions for 6 minutes at ambient temperature (20° C.). After 6 minutes, the samples were removed and blotted dry with a non-lint plate wipe fabric and immediately reweighed and re-measured for thickness. The difference in thickness between the initial and post soak sample measurements are listed in TABLE I as "% Plate Swell." The difference in weight between the initial and post soak sample measurements are listed as "% Plate Weight Gain".

TABLE I below also lists the amount of non-VOC solvents for the different developer compositions.

As can be seen in TABLE I, the solvent composition without any Rhodiasolv® Iris (Comparative Example 3) shows significantly higher level of plate swelling, compared to the developer compositions of the present invention. Excessive plate swelling could lead to plate performance issues. The compositions of current invention, not only reduces the swell of the plate, but also provides the benefit of enhanced environmentally friendliness due to presence of Rhodiasolv® Iris in significant quantity.

The invention has been described in detail with particular reference to certain preferred embodiments thereof, but it will be understood that variations and modifications can be effected within the spirit and scope of the invention.

TABLE I

| Examples | Developer Solvent (by weight) | Developer Time (min) | Dry Time (min) | Image Quality | % Plate Swell | % Plate Weight Gain | Solvent Odor | % Non-VOC Solvents |
|---|---|---|---|---|---|---|---|---|
| Invention 3 | 10% Rhodia, 90% DIPB | 7 | 60 | Excellent | 14.3 | 11.84 | Mild | 10 |
| Invention 4 | 20% Rhodia, 80% DIPB | 8 | 60 | Excellent | 13.4 | 11.52 | Mild | 20 |
| Invention 5 | 30% Rhodia, 70% DIPB | 8 | 90 | Excellent | 11.6 | 11.01 | Mild | 30 |
| Invention 6 | 40% Rhodia, 60% DIPB | 8 | 90 | Excellent | 9.6 | 10.23 | Mild | 40 |
| Invention 7 | 50% Rhodia, 50% DIPB | 10 | 90 | Excellent | 9.0 | 9.41 | Mild | 50 |
| Invention 8 | 60% Rhodia, 40% DIPB | 11 | 90 | Excellent | 5.2 | 6.99 | Mild | 60 |
| Comparative 3 | 0% Rhodia, 100% DIPB | 7 min | 70 | Excellent | 16.5 | 12.14 | Mild | 0 |

"Rhodia" is Rhodiasolv ® Iris,
DIPB is diisopropylbenzene

The invention claimed is:

1. A method for providing a flexographic printing plate comprising:
   A) imagewise exposing a flexographic printing plate precursor comprising a photopolymerizable elastomeric layer comprising a photopolymerizable composition to curing radiation to provide exposed cured regions and non-exposed non-cured regions in the photopolymerizable elastomeric layer,
   B) removing the non-exposed non-cured regions from the photopolymerizable elastomeric layer with a processing solution to provide a relief image in the photopolymerizable elastomeric layer, resulting in a flexographic printing plate, the processing solution comprising 1) diisopropylbenzene, and 2) one or more organic co-solvents, at least one of which is an aliphatic dibasic acid ester, and
   C) optionally, drying the processed flexographic printing plate,
   wherein the aliphatic dibasic acid ester is dimethyl-2-methylglutarate or diisobutyl methylglurarate, and
   the processing solution further comprises one or more alcohols that are chosen from n-butanol, 2-ethoxyethanol, benzyl alcohol, a hexyl alcohol, a heptyl alcohol, an octyl alcohol, a nonyl alcohol, a decyl alcohol, 2-phenylethyl alcohol, isopronylbenzyl alcohol, alpha-terpineol, dipropylene glycol methyl ether, 2-butoxyethanol, isopropyl alcohol, and 2-(2-butoxyethoxy) ethanol, substituted or unsubstituted cyclopentanol, substituted or unsubstituted cyclohexanol, substituted or unsubstituted cycloheptanol, cyclopentyl substituted alcohol, cyclohexyl substituted alcohol, and cycloheptyl substituted alcohol.

2. The method of claim 1 wherein the processing solution comprises up to 95 weight % of diisopropylbenzene, and from about 5 to about 70 weight % of the organic co-solvents.

3. The method of claim 1 wherein the aliphatic dibasic acid ester is present in an amount of from about 5 and less than 70 weight %.

4. The method of claim 1 wherein the weight ratio of diisopropylbenzene to the aliphatic dibasic acid ester is from about 1:10 to about 5:1.

5. The method of claim 1 wherein the one or more alcohols are present in an amount of up to 35 weight %.

6. The method of claim 1, wherein the processing solution further comprises a hydrocarbon paraffin, isoparaffin, naphthenic hydrocarbon, or a combination thereof.

7. The method of claim 1 wherein the photopolymerizable elastomeric layer comprises an elastomeric binder, an initiator, at least one monomer, and optionally a plasticizer, and the precursor is imagewise exposed using actinic radiation.

8. The method of claim 1 comprising imagewise exposing the flexographic printing plate precursor through a mask image.

9. The method of claim 8 comprising imagewise exposing the flexographic printing plate precursor through a mask image using radiation having a wavelength of from about 340 nm to about 400 nm.

10. The method of claim 1 wherein the photopolymerizable elastomeric layer is disposed on a non-photosensitive support.

11. The method of claim 1 further comprising drying and post-curing the processed flexographic printing plate.

12. A method for providing a flexographic printing plate comprising:
   A) imagewise exposing a flexographic printing plate precursor comprising a photopolymerizable elastomeric layer comprising a photopolymerizable composition to curing radiation to provide exposed cured regions and non-exposed non-cured regions in the photopolymerizable elastomeric layer,
   B) removing the non-exposed non-cured regions from the photopolymerizable elastomeric layer with a processing solution to provide a relief image in the photopolymerizable elastomeric layer, resulting in a flexographic printing plate, and
   C) optionally, drying the processed flexographic printing plate, wherein the processing solution comprises:
      from about 30 to about 80 weight % of diisopropylbenzene,
      from about 10 to about 60 weight % of dimethyl-2-methylglutarate, and
      from about 5 to about 35 weight % of one or more alcohols selected from the group consisting of benzyl alcohol, 2-ethylhexyl alcohol, 2-phenylethyl alcohol, and isopropylbenzyl alcohol, and
      and the weight ratio of diisopropylbenzene to dimethyl-2-methylglutarate is from about 1:9 to about 3:2.

13. A method for providing a flexographic printing plate comprising:
   A) imagewise exposing a flexographic printing plate precursor comprising a photopolymerizable elastomeric layer comprising a photopolymerizable composition to curing radiation to provide exposed cured regions and non-exposed non-cured regions in the photopolymerizable elastomeric layer, B) removing the non-exposed non-cured regions from the photopolymerizable elastomeric layer with a processing solution to provide a relief image in the photopolymerizable elastomeric layer, resulting in a flexographic printing plate, the processing solution consisting essentially of 1) diisopropylbenzene, and 2) one or more aliphatic dibasic acid esters, and C) optionally, drying the processed flexographic printing plate.

14. The method of claim 13 wherein the aliphatic dibasic acid ester is an aliphatic diester of oxalic acid, malonic acid, succinic acid, glutaric acid, adipic acid, pimelic acid, suberic acid, azelaic acid, or sebacic acid, or combinations thereof, that is present in an amount of from about 10 to about 65 weight %.

* * * * *